United States Patent
Rahman et al.

(10) Patent No.: US 7,701,057 B1
(45) Date of Patent: Apr. 20, 2010

(54) SEMICONDUCTOR DEVICE HAVING STRUCTURES FOR REDUCING SUBSTRATE NOISE COUPLED FROM THROUGH DIE VIAS

(75) Inventors: Arifur Rahman, San Jose, CA (US); Stephen M. Trimberger, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 138 days.

(21) Appl. No.: 11/796,101

(22) Filed: Apr. 25, 2007

(51) Int. Cl.
 *H01L 23/48* (2006.01)
(52) U.S. Cl. ............... 257/750; 257/484; 257/E23.019
(58) Field of Classification Search ................. 257/508, 257/659, 664, 774, 773, 728, 127, 484, 750, 257/E23.019; 361/788
 See application file for complete search history.

(56) References Cited

U.S. PATENT DOCUMENTS

| | | | | |
|---|---|---|---|---|
| 4,757,363 | A * | 7/1988 | Bohm et al. | 257/358 |
| 5,151,770 | A * | 9/1992 | Inoue | 257/660 |
| 5,814,889 | A * | 9/1998 | Gaul | 257/773 |
| 6,472,723 | B1 * | 10/2002 | Jarstad et al. | 257/659 |
| 6,608,762 | B2 * | 8/2003 | Patriche | 361/788 |
| 7,239,526 | B1 * | 7/2007 | Bibee | 361/788 |
| 7,439,621 | B1 * | 10/2008 | Ishida et al. | 257/728 |
| 2002/0164851 | A1 * | 11/2002 | Wu et al. | 438/215 |
| 2005/0178585 | A1 * | 8/2005 | Kim et al. | 174/262 |

FOREIGN PATENT DOCUMENTS

DE 2853116 A * 6/1980

OTHER PUBLICATIONS

Mutschler, Ann Steffora, "IBM details 3-D chip stacking breakthrough", Apr. 12, 2007, 3 pages, Semiconductor International Print Page.

Mutschler, Ann Steffora, "IBM details 3-D chip stacking breakthrough", Apr. 12, 2007, 2 pages, Electronic News, Semiconductor International, Reed Electronic Group, http://www.reed-electronics.com/semiconductor/article/CA6433308?spacedesc&industryid=3026.

* cited by examiner

*Primary Examiner*—Jerome Jackson, Jr.
*Assistant Examiner*—Dale Page
(74) *Attorney, Agent, or Firm*—Robert M. Brush

(57) ABSTRACT

A semiconductor device having structures for reducing substrate noise coupled from through die vias (TDVs) is described. In one example, a semiconductor device has a substrate, at least one signal through die via (TDV), and ground TDVs. The substrate includes conductive interconnect formed on an active side thereof. The conductive interconnect includes ground conductors and digital signal conductors. Each signal TDV is formed in the substrate and is electrically coupled to at least one of the digital signal conductors. The ground TDVs are formed in the substrate in a ring around the at least one signal TDV. The ground TDVs are electrically coupled to the ground conductors. The ground TDVs provide a sink for noise coupled into the substrate from the signal TDVs. In this manner, the ground TDVs mitigate noise coupled to noise-sensitive components formed on the substrate.

18 Claims, 8 Drawing Sheets

SEMICONDUCTOR DEVICE HAVING STRUCTURES FOR REDUCING SUBSTRATE NOISE COUPLED FROM THROUGH DIE VIAS

FIELD OF THE INVENTION

One or more aspects of the present invention relate generally to semiconductor devices and, more particularly, to a semiconductor device having structures for reducing substrate noise coupled from through die vias (TDVs).

BACKGROUND OF THE INVENTION

As semiconductor technology has advanced, the amount and speed of logic available on an integrated circuit (IC) has increased more rapidly than the number and performance of input/output (I/O) connections. As a result, IC die stacking techniques have received renewed interest to address the interconnection bottleneck of high-performance systems. In stacked IC applications, two or more ICs are stacked vertically and interconnections between them are made by wire bonding at chip periphery or by forming high aspect ratio through die vias (TDVs). There are several approaches for stacking ICs. Multiple silicon device layers can be grown epitaxially or fully processed ICs can be bonded for vertical integration.

In addition, the need to integrate more functionality on each IC die has lead to the development of more and more mixed signal ICs (i.e., ICs having digital and analog circuits). For example, mixed signal ICs may include a large digital circuit and one or more smaller mixed signal circuits and/or analog circuits, such as analog-to-digital (ND) converters, phase locked loops (PLLs), delay locked loops (DLLs), voltage controlled oscillators (VCOs), and the like. In a mixed signal IC, however, attention must be paid to the interaction between the digital and analog circuits. The digital circuits will create noise, particularly from switching actions, which will degrade the performance of analog circuits if such noise is not compensated. A major part of this noise coupling occurs via the common substrate.

In particular, digital circuits generate significant amounts of undesired noise currents both in the substrate and on the power supply lines during operation. Since the underlying substrate is semi-conductive by nature, the noise generated by digital circuits can easily be injected into the substrate and propagate through the die. This substrate noise may be injected into sensitive circuits, such as analog and/or mixed signal circuits on the die and affect their operation. Substrate noise generation is caused by various mechanisms, including impact ionization, capacitive coupling, and power supply-ground bounce. Notably, capacitive coupling of noise into the substrate is caused by displacement currents in the substrate created by switching signals. Capacitive coupling is attributed to multiple parasitic capacitances, including reverse-biased source/drain to bulk junction capacitance, n-well to bulk capacitance, interconnect-to-substrate capacitance, and the like.

In a conventional IC die, capacitively-coupled noise propagates laterally and vertically through the substrate, but overall is confined near the active surface of the substrate. Presently, capacitively-coupled noise in the substrate is minimized by following appropriate design rules to maintain a safe distance between a noisy circuit and a noise-sensitive circuit. As the active area on a die is at a premium, it is not always desirable or even possible maintain such safe distances in a design. Furthermore, unlike substrate coupling in conventional ICs, substrate coupling in stacked ICs with TDVs occurs deep into the substrate. This is due to the capacitive-coupling of noise from signal TDVs that extend through the substrate. Accordingly, there exists a need in the art for techniques to reduce substrate-coupling of noise from TDVs in stacked ICs.

SUMMARY OF THE INVENTION

One aspect of the invention relates to a semiconductor device having a substrate, at least one signal through die via (TDV), and ground TDVs. The substrate includes conductive interconnect formed on an active side thereof. The conductive interconnect includes ground conductors and digital signal conductors. Each signal TDV is formed in the substrate and is electrically coupled to at least one of the digital signal conductors. The ground TDVs are formed in the substrate in a ring around the at least one signal TDV. The ground TDVs are electrically coupled to the ground conductors.

Another aspect of the invention relates to a semiconductor device having a substrate, a group of signal TDVs, and a ring structure. The substrate includes conductive interconnect formed on an active side thereof. The conductive interconnect includes ground conductors and digital signal conductors. The group of signal TDVs is formed in the substrate. Each of the signal TDVs in the group is electrically coupled to at least one of the digital signal conductors. The ring structure is formed in the substrate around the group of signal TDVs. The ring structure is electrically coupled to at least one of the ground conductors. In one embodiment, the ring structure comprises a diffusion ring implanted into the substrate. In another embodiment, the ring structure comprises a ring of ground TDVs.

Another aspect of the invention relates to a semiconductor device having a substrate, signal TDVs, and ground TDVs. The substrate includes conductive interconnect formed on an active side thereof. The conductive interconnect includes ground conductors and digital signal conductors. The signal TDVs are formed in the substrate and are electrically coupled to the digital signal conductors. Each of the signal TDVs is insulated from the substrate. The ground TDVs are formed in the substrate and are electrically coupled to the ground conductors. Each of the ground TDVs is in direct contact with the substrate.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
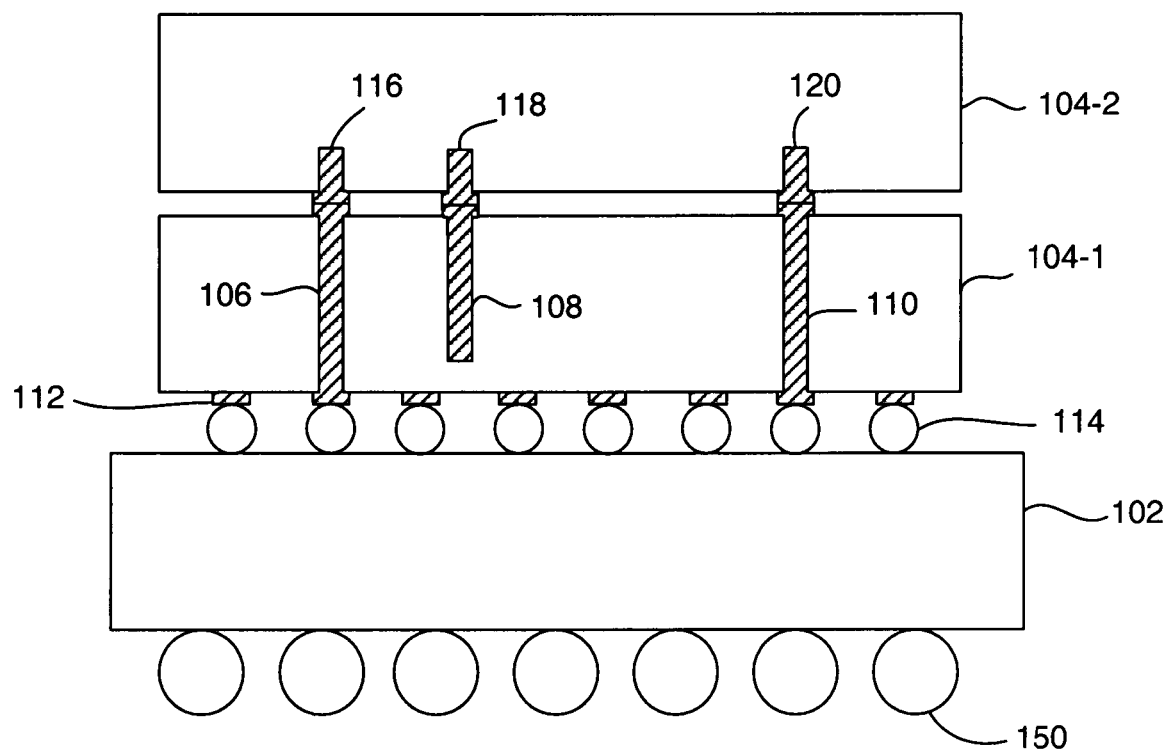
FIG. 1 is a cross-sectional view showing an exemplary embodiment of a semiconductor device in accordance with one or more aspects of the invention.

FIG. 1 is a cross-sectional view showing an exemplary embodiment of a semiconductor device 100 in accordance with one or more aspects of the invention. The semiconductor device 100 includes a carrier substrate 102 and semiconductor die 104-1 and 104-2 (collectively referred to as die 104). The die 104 are vertically stacked and mounted to the carrier substrate 102. In the embodiment shown, each of the die 104 is mounted face side down in flip-chip fashion. The term "face side" denotes the side of a die that receives the bulk of semiconductor processing such that circuitry is fabricated on that face side of the die. The side of a die opposite the face side is referred to as the backside of the die.

Each die 104 includes circuitry formed on a semiconductor substrate and conductive interconnect formed over the circuitry. The conductive interconnect generally includes a plurality of metal layers patterned using known photolithography techniques, an array of contacts on the face side, and a pattern of vias. The contacts provide an external interface to the circuitry formed on the die. The vias electrically interconnect various portions of the metal layers and contacts. Suitable materials for the metal layers, vias, and contacts include aluminum, chromium, titanium, nickel, iridium, copper, gold, tungsten, silver, platinum, palladium, tantalum, molybdenum, or alloys of such materials. The metal layers are separated from one another by layers of insulator material, such as silicon dioxide ($SiO_2$), phospho-Silicate Glass (PSG), Boron-Doped PSG (BPSG), tetraethyl-ortho-silicate (TEOS), and the like. Examples of circuitry and conductive interconnect for a die are described below.

In the example shown, the die 104-1 includes a plurality of contacts 112 (e.g., eight are shown). Each of the contacts 112 is electrically and mechanically coupled to the carrier substrate 102 by the solder bumps 114. The carrier substrate 102 includes conductive interconnect similar to that of the die 104. The die 104-1 is mounted face down on the top surface of the carrier substrate 102 in a flip-chip manner. The solder bumps 114 are registered with matching contacts on the carrier substrate 102 and then reflowed to form solder joints. This technique for mounting the die 104-1 on the carrier substrate 102 is known as controlled collapse chip connect (C4). The carrier substrate 102 includes an array of solder balls 150 on the bottom surface thereof. The solder balls 150 may be registered with matching conductors on a circuit board, for example, and then reflowed to electrically connect the semiconductor device 100 to the circuit board.

The die 104-2 is configured to electrically communicate with the die 104-1 and/or the carrier substrate 102. In order to communicate with the die 104-2, the die 104-1 includes through die vias (TDVs). A TDV provides an electrical pathway through the conductive interconnect and semiconductor substrate of the die 104-1. In the present example, the die 104-1 includes TDVs 106, 108, and 110. The TDVs 106 and 110 extend from the face side to the back side of the die 104-1 and are used to couple signals, power, or ground from the carrier substrate 102 to the die 104-2. The TDV 108 extends from the conductive interconnect to the back side of the die 104-1. The TDV 108 is used to coupled signal, power, or ground from the die 104-1 to the die 104-2. The difference between the TDVs 106/110 and the TDV 108 is that the TDV 108 does not include a contact on the face side of the die 104-1 for communication with the carrier substrate 102. Although only three TDVs are shown in the exemplary cross-section, those skilled in the art will appreciate that, in general, there may be a multiplicity of TDVs formed throughout the die 104-1. For example, present state of the art devices may include hundreds or thousands of TDVs.

The die 104-2 includes vias 116, 118, and 120. The vias 116, 118, and 120 are conventional vias that couple the TDVs 106, 108, and 110 to the conductive interconnect of the die 104-2. The vias 116, 118, and 120 are electrically and mechanically coupled to the TDVs 106, 108, and 110 using micro-bumps or like type solder contacts, or other known structures used in stacked die configurations (not shown). Note that the conventional vias 116, 118, and 120 are distinguishable from the TDVs 106, 108, and 110. The conventional vias are used to connect metal layers of a die. The TDVs extend through a substrate of the die and may also extend through at least a portion of the conductive interconnect.

Embodiments of the invention for reducing capacitively-coupled noise currents injected from TDVs into a die substrate are described below. In the following description, semiconductor substrates of the die 104 are described as comprising p-type doped silicon. The substrates may be lightly doped throughout or may comprise a lightly doped epitaxial layer on top of a more heavily doped layer. For clarity, such an epitaxial layer, if present, is omitted from the drawings. While p-type substrates are described by example, those skilled in the art will appreciate that the description below also applies to n-type substrates.

Figure 2:
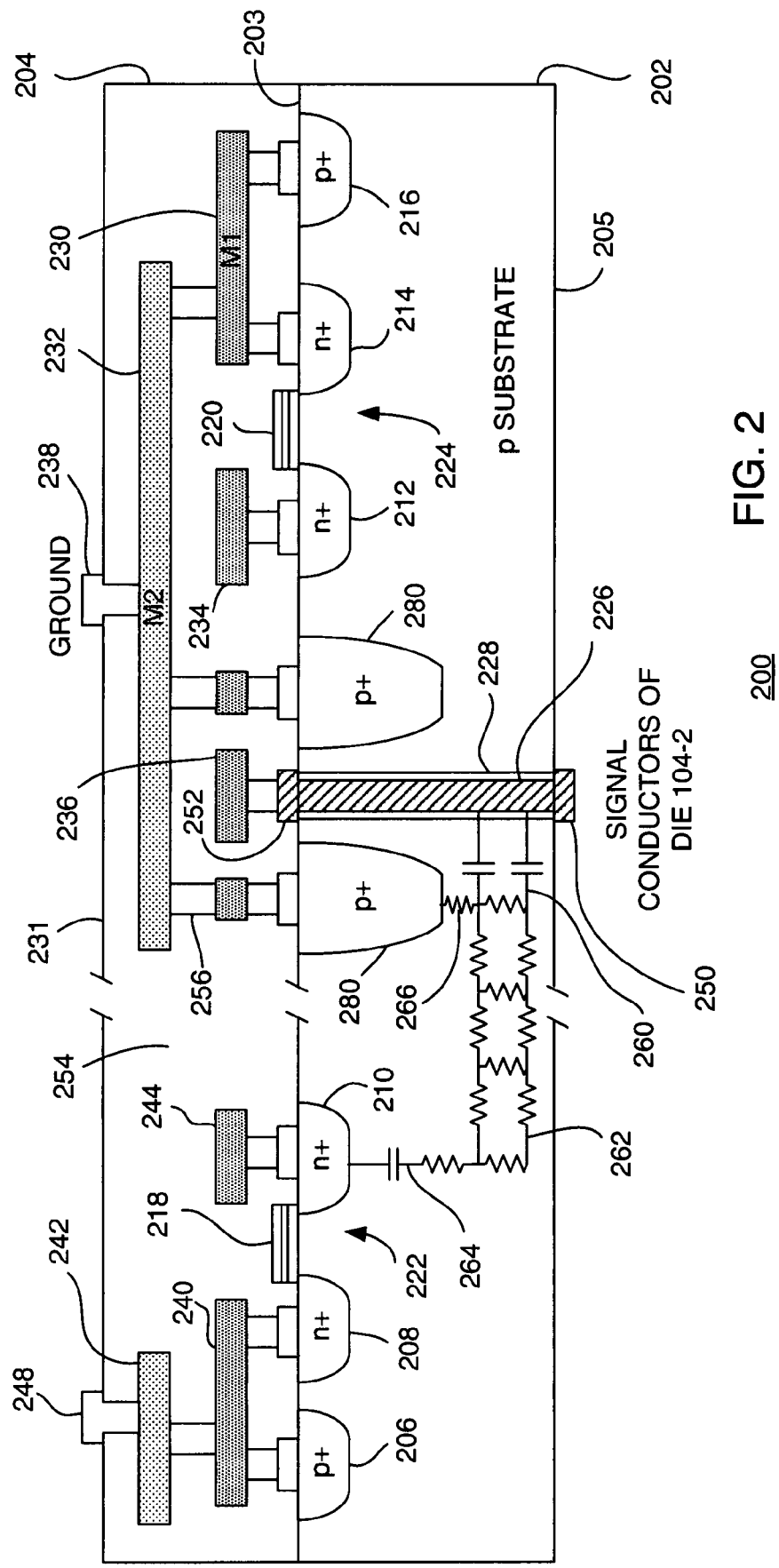
FIG. 2 is a cross-sectional view showing an embodiment of a portion of an integrated circuit die in accordance with one or more aspects of the invention.

FIG. 2 is a cross-sectional view showing an embodiment of a portion 200 of the integrated circuit die 104-1 in accordance with one or more aspects of the invention. The portion 200 includes a substrate 202 and conductive interconnect 204. In the present example, the substrate 202 comprises p-type doped silicon. The substrate 202 includes an active side 203 and a back side 205. The conductive interconnect 204 is formed over the active side 203. The substrate 202 includes highly doped diffusions 206, 208, 210, 212, 214, and 216. As is conventional, a highly doped region is indicated by a "+" following the type. Thus, the diffusions 206 and 216 are p+ diffusion regions, and the diffusions 208, 210, 212, and 214 are n+ diffusion regions. Polysilicon regions 218 and 220 are formed over an insulating layer on the substrate 202. The polysilicon region 218, the n+ diffusion 208, and the n+ diffusion 210 form the gate, source, and drain, respectively, of a transistor 222. The polysilicon region 220, the n+ diffusion 212, and the n+ diffusion 214 form the gate, drain, and source, respectively, of a transistor 224. The p+ diffusions 206 and 216 form substrate contacts. The substrate 202 also includes a p+ diffusion formed in a ring around the TDV 226 ("diffusion ring 280").

The substrate 202 also includes a TDV 226 extending from the back side 205 to the active side 203 of the substrate 202. The TDV 226 includes a contact 250 on the back side 205, and a contact 252 on the active side 203. Insulation 228 is provided between the TDV 226 and the substrate 202. The insulation 228 may comprise, for example, TEOS or the like.

The conductive interconnect 204 illustratively includes two metal layers, designated as M1 and M2, and vias 256. Insulative material 254 isolates the metal layers M1 and M2, as well as the polysilicon layer (e.g., potions 218 and 220 are shown). A portion 230 of M1 makes contact with the source 214 of the transistor 224 and the substrate contact 216. The portion 230 is coupled to a portion 232 of M2. Another portion 234 of M1 makes contact with the drain 212 of the transistor 224. A portion 236 of M1 is coupled to the contact 252 of the TDV 226. The diffusion ring 280 is coupled to the portion 232 of M2. The portion 232 is coupled to a contact 238 on a top 231 of the conductive interconnect 204. The top 231 defines that face side of the die 104-1.

Another portion 240 of M1 makes contact with the source 208 of the transistor 222 and the substrate contact 206. The portion 240 is coupled to a portion 242 of M2, which in turn is coupled to a contact 248 on the top 231 of the conductive interconnect 204. Another portion 244 of M1 is coupled to the drain of the transistor 210. The metallization depicted in FIG. 2 is merely exemplary. Notably, a semiconductor die may include more than two interconnect layers. For example, present state of the art technology (e.g., 65 nm processing) may provide up to 12 metal layers (M1 through M12).

Assume the transistor 224 is part of a digital circuit, and the transistor 222 is part of a noise-sensitive circuit, such as an analog circuit. Assume further that the TDV 226 is coupled to a signal conductor of the die 104-2 via the contact 250. By "signal conductor," it is meant that the conductor propagates a digital signal between the die 104-1 and the die 104-2. For example, the TDV 226 may be configured to propagate a digital signal between the drain 212 of the transistor 224 and circuitry formed in the die 104-2. The TDV 226 may be referred to as a "signal TDV." Assume further that the contact 238 is coupled to ground. Thus, the diffusion ring 280 is also coupled to ground.

The signal TDV 226 is capacitively-coupled to the substrate 202, as is represented by capacitors 260. Noise currents generated by the digital signal will be injected into the substrate 202 from the TDV 226 via the capacitive-coupling. Depending on the material properties of the substrate 202 and the frequency of the generated noise, the substrate 202 may be treated as a purely resistive medium modeled by resistance elements, a diffusive medium modeled by resistive and capacitive elements, or a general medium modeled by resistive, capacitive, and inductive elements. For purposes of exposition, assume that the substrate 202 is resistive and may be modeled as a mesh network of resistors 262. Those skilled in the art will appreciate that the principles described below are also applicable to substrates modeled as a resistor-capacitor network or a resistor-capacitor-inductor network.

The n+ diffusion 210 is also capacitively-coupled to the substrate 202, as is represented by a capacitor 264. As such, an impedance path is formed between the TDV 226 and the n+ diffusion 210 of the transistor 222, including the capacitive-coupling between the TDV 226 and the substrate 202, the resistive substrate 202 between the TDV 226 and the n+ diffusion 210, and the capacitive-coupling between the n+ diffusion 210 and the substrate 202. Substrate noise currents (e.g., noise generated by the digital signal on the TDV 226) will be coupled to the n+ diffusion 210 through this impedance path. In accordance with one aspect of the invention, the diffusion ring 280 provides a sink for noise currents injected into the substrate 202 from the TDV 226.

Notably, the diffusion ring 280, having the same type of doping as the substrate 202, may be considered to be resistively coupled to the substrate 202, as is represented by the resistor 266. An impedance path is thereby formed between the TDV 226 and the diffusion ring 280. This impedance path includes the capacitive-coupling between the TDV 226 and the substrate 202, the resistive substrate 202 between the TDV 226 and the p+ diffusion ring 280, and the resistive-coupling between the p+ diffusion ring 280 and the substrate 202. Since the diffusion ring 280 is more proximate the TDV 226 than the transistor 222, the impedance path between the TDV 226 and the diffusion ring 280 exhibits less impedance than the impedance path between the TDV 226 and the transistor 222. Thus, a larger portion of the noise currents will flow to the diffusion ring 280. In this manner, the diffusion ring 280 reduces noise currents coupled to the transistor 222.

For example, assume signal TDVs each have a 15 µm diameter, a 25 µm pitch, and are 150 µm deep. Assume each of the signal TDVs have 1 µm of oxide insulation. Then, without the diffusion ring described above, noise injected into a noise-sensitive component may be 100 mV or more. On the other hand, if the signal TDVs are surrounded by a diffusion ring as described above, the injected noise is approximately 4 mV. Thus, the diffusion ring 280 achieves a substantial reduction in substrate-coupled noise from the signal TDV 226. The dimensions of the signal TDVs are merely exemplary. Presently, TDVs may be formed in substrates having diameters between 7 µm and 15 µm; pitch may be between 1.5 and 2 times the diameter; and TDVs may be formed to depths between 50 µm and 150 µm.

Since the TDV 226 injects noise currents deep into the substrate 202, the diffusion ring 280 must be implanted deep into the substrate 202. That is, the diffusion ring 280 is implanted deeper in the substrate 202 than the diffusion regions of the circuit elements (e.g., n+ diffusions for the transistors and p+ diffusions for the substrate contacts). For example, the diffusion region 280 may be implanted to a depth of approximately 1 µm to 5 µm.

Although an impedance path has been shown between the TDV 226 and an n-channel transistor, a similar impedance path would exist between the TDV 226 and a p-channel transistor. For a p-channel device formed in an n-well, a p+ diffusion is capacitively-coupled to the n-well, and the n-well is capacitively-coupled to the substrate. Substrate noise currents will be coupled to the p+ diffusion through such an impedance path. The diffusion ring 280 will also reduce noise currents coupled to a p-channel device in a similar fashion as the n-channel device.

Figure 3:
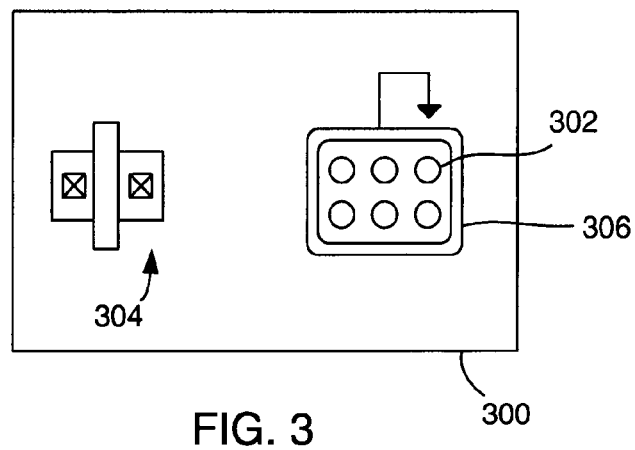
FIG. 3 is a plan view depicting another embodiment of a portion of an integrated circuit die in accordance with one or more aspects of the invention.

Although only a single TDV 226 is shown in the portion 200, it is to be understood that the diffusion ring 280 may surround more than one TDV. For example, FIG. 3 is a plan view depicting another embodiment of a portion 300 of the integrated circuit die 104-1 in accordance with one or more aspects of the invention. The portion 300 includes a plurality of signal TDVs 302 (e.g., six are shown) and a noise-sensitive device 304 (e.g., a transistor). A diffusion ring 306 is formed to surround the signal TDVs 302. The diffusion ring 306 is coupled to ground. In this manner, a diffusion ring may be used to mitigate noise currents generated by any number of signal TDVs in a substrate.

Figure 4:
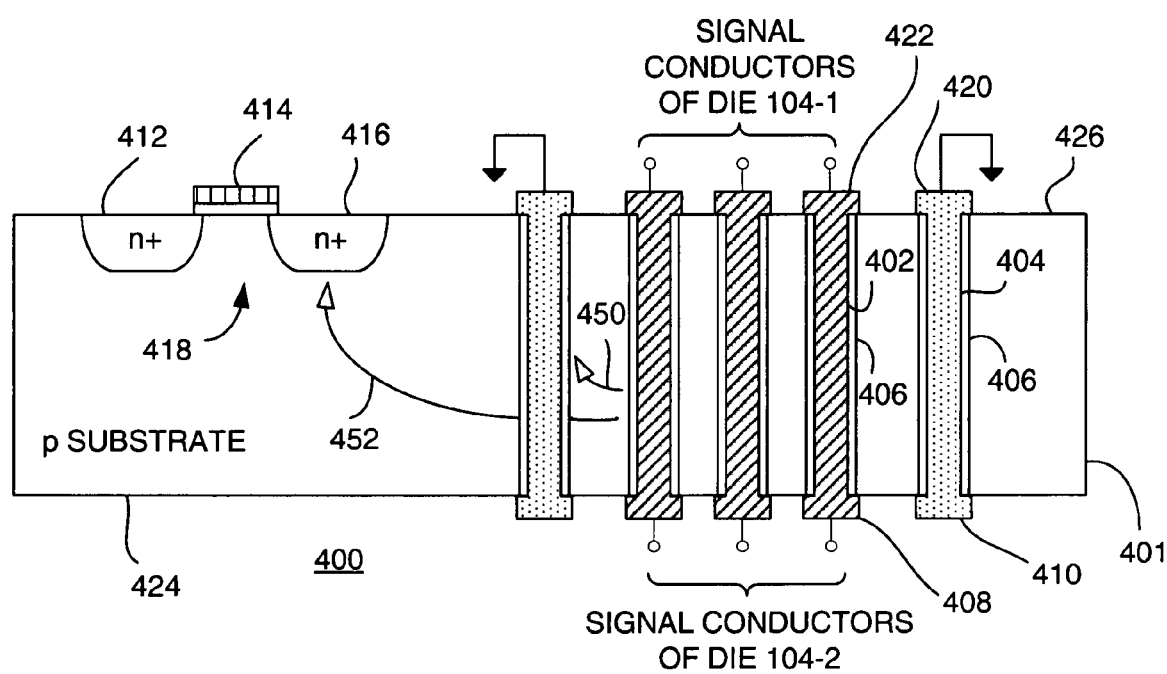
FIG. 4 is a cross sectional view depicting another embodiment of a portion of an integrated circuit die in accordance with one or more aspects of the invention.
Figure 5:
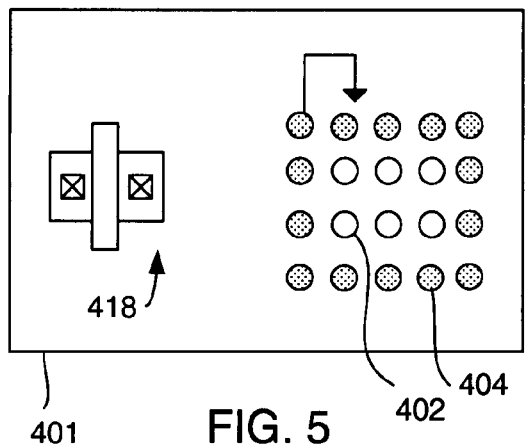
FIG. 5 is a plan view of the integrated circuit die portion of FIG. 4.

FIG. 4 is a cross sectional view depicting another embodiment of a portion 400 of the integrated circuit die 104-1 in accordance with one or more aspects of the invention. FIG. 5 is a plan view of the portion 400. The portion 400 includes a substrate 401. For purposes of clarity, the details of the conductive interconnect are omitted. In the present example, the substrate 401 is formed of p-type doped silicon. The substrate 401 includes an active side 426 and a back side 424. The substrate 401 includes a plurality of TDVs 402 (e.g., six are shown in FIG. 5) and a plurality of TDVs 404 (e.g., 12 are shown in FIG. 5) formed in the substrate 401. The TDVs 402 and 404 extend from the back side 424 to the active side 426. The TDVs 402 each include a contact 408 on the back side 424 and a contact 422 on the active side 426. The TDVs 404 each include a contact 410 on the back side 424 and a contact 420 on the active side 426. Insulation 406 is provided between the TDVs 402 and 404 and the substrate 401. An n+ diffusion 412, a gate region 414, and an n+ diffusion 416 form source, gate, and drain of a transistor 418. The transistor 418 is part of a noise-sensitive circuit.

The TDVs 402 are coupled to one or more signal conductors of the die 104-2 and are configured to propagate digital signals ("signal TDVs 402"). The TDVs 404 are coupled to one or more ground conductors of the die 104-1 and are configured to provide ground distribution to the die 104-2 ("ground TDVs 404"). As shown in FIG. 5, the ground TDVs 404 form a ring around the signal TDVs 402. That is, the ground TDVs 404 form discrete points of a ring that surrounds the signal TDVs 402. The ground TDVs 404 provide a sink for noise currents injected into the substrate 401 from the signal TDVs 402.

Notably, the signal TDVs 402 are capacitively coupled to the substrate 401. The ground TDVs 404 are also capacitively coupled to the substrate 401. Impedance paths are thereby formed between the signal TDVs 402 and the ground TDVs 404 through the resistive substrate 401 (collectively represented by an impedance path 450). Impedance paths are also formed between the signal TDVs 402 and the transistor 418 (collectively represented by an impedance path 452). Since the ground TDVs 404 are more proximate the signal TDVs 402 than the transistor 418, the path 450 exhibits less impedance than the path 452. Thus, a larger portion of the noise currents will flow through the impedance path 450 than the impedance path 452. In this manner, the ground TDVs 404 reduce noise currents coupled to the transistor 418. The grounded TDVs 404 provide a better noise sink than the diffusion ring described above, since the TDVs 404 extend deeper into the substrate (e.g., from the back side to the active surface).

Again, assume signal TDVs each have a 15 μm diameter, a 25 μm pitch, and are 150 μm deep. Assume each of the signal TDVs have 1 μm of oxide insulation. Surrounding the signal TDVs 402 with the ground TDVs 404 reduces the substrate-coupled noise to less than 100 μV. Thus, the ring of ground TDVs significantly reduces noise injected by the signal TDVs as compared to no mitigation (where noise can be 100 mV or more) and use of a diffusion ring (where noise is approximately 4 mV). The pitch of the TDVs 402 and 404 may be between 1.5 and 2 times the diameter of the TDVs. The diameter may range between 7 and 15 μm. In one example, the signal TDVs 402 and the ground TDVs 404 have 15 μm and 25 μm pitch (i.e., 10 μm via-to-via separation).

In the present embodiment, the ground TDVs 404 have the same diameter as the signal TDVs 402. The ground TDVs 404 are also used to distribute ground to the die 104-2. In another embodiment, ground TDVs may have smaller diameters than the signal TDVs. In such an embodiment, the ground TDVs may not be used to distribute ground to the die 104-2 and may instead be "dummy TDVs."

Figure 7:
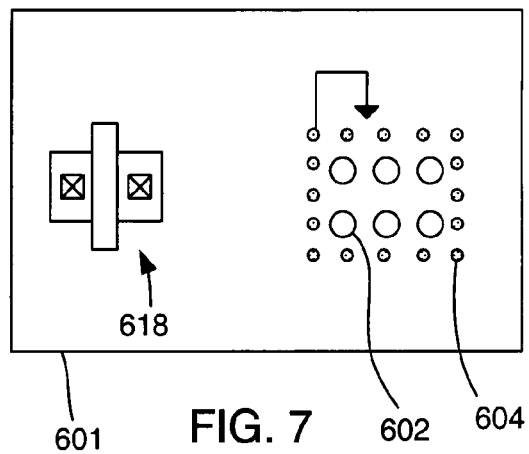
FIG. 7 is a plan view of the integrated circuit die portion of FIG. 6.
Figure 6:
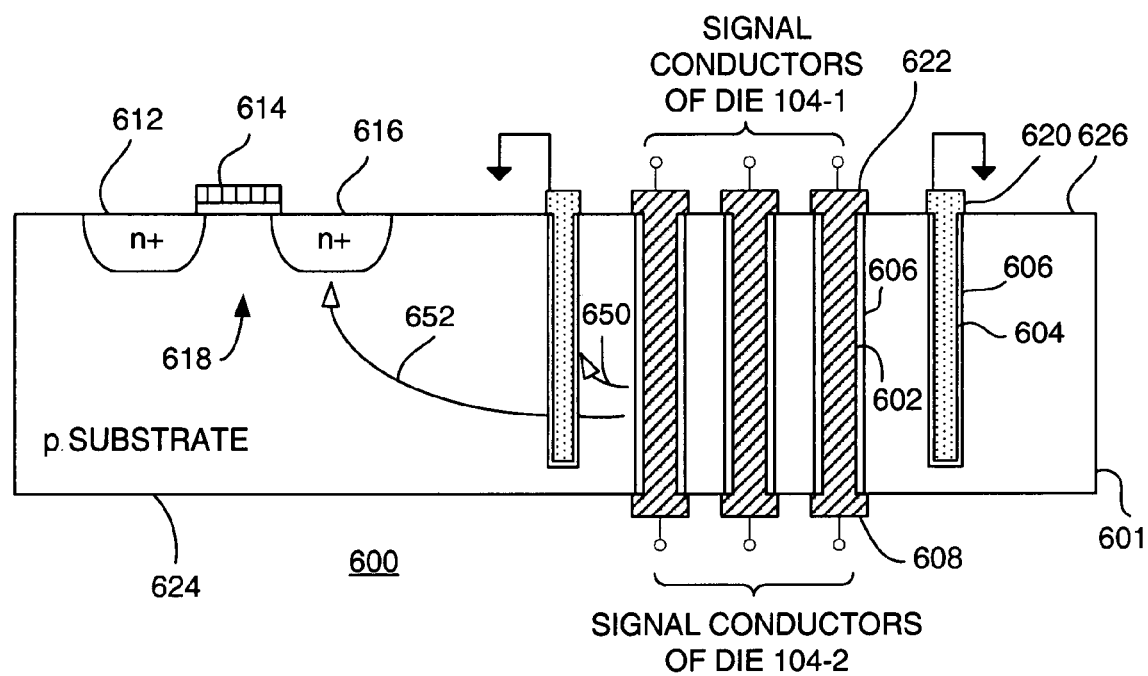
FIG. 6 is a cross sectional view depicting another embodiment of a portion of an integrated circuit die in accordance with one or more aspects of the invention.

In particular, FIG. 6 is a cross sectional view depicting another embodiment of a portion 600 of the integrated circuit die 104-1 in accordance with one or more aspects of the invention. FIG. 7 is a plan view of the portion 600. The portion 600 includes a substrate 601. For purposes of clarity, the details of the conductive interconnect are omitted. In the present example, the substrate 601 is formed of p-type doped silicon. The substrate 601 includes an active side 626 and a back side 624. The substrate 601 includes a plurality of TDVs 602 (e.g., six are shown in FIG. 7) and a plurality of TDVs 604 (e.g., 12 are shown in FIG. 7) formed in the substrate 601. The TDVs 602 extend from the back side 624 to the active side 626. The TDVs 602 each include a contact 608 on the back side 624 and a contact 622 on the active side 626. The TDVs 604 each extend from the active side 626 to point proximate the back side 624. That is, the TDVs 604 extend into, but not through, the substrate 601. The TDVs 604 each include a contact 620 on the active side 626. Insulation 606 is provided between the TDVs 602 and 604 and the substrate 601. An n+ diffusion 612, a gate region 614, and an n+ diffusion 616 form source, gate, and drain of a transistor 618. The transistor 618 is part of a noise-sensitive circuit.

The TDVs 602 are coupled to one or more signal conductors of the die 104-2 and are configured to propagate digital signals ("signal TDVs 602"). The TDVs 604 are coupled to one or more ground conductors of the die 104-1 and are configured to provide ground distribution to the die 104-2 ("ground TDVs 604"). As shown in FIG. 7, the ground TDVs 604 form a ring around the signal TDVs 602. That is, the ground TDVs 604 form discrete points of a ring that surrounds the signal TDVs 602. The ground TDVs 604 provide a sink for noise currents injected into the substrate 601 from the signal TDVs 602.

Notably, the signal TDVs 602 are capacitively coupled to the substrate 601. The ground TDVs 604 are also capacitively coupled to the substrate 601. Impedance paths are thereby formed between the signal TDVs 602 and the ground TDVs 604 through the resistive substrate 601 (collectively represented by an impedance path 650). Impedance paths are also formed between the signal TDVs 602 and the transistor 618 (collectively represented by an impedance path 652). Since the ground TDVs 604 are more proximate the signal TDVs 602 than the transistor 618, the path 650 exhibits less impedance than the path 652. Thus, a larger portion of the noise currents will flow through the impedance path 650 than the impedance path 652. In this manner, the ground TDVs 604 reduce noise currents coupled to the transistor 618.

The ground TDVs 604 have smaller diameters than the signal TDVs 602. The smaller diameter ground TDVs 604 minimize area overhead. In the present embodiment, the smaller diameter ground TDVs 604 are "dummy" TDVs that do not play a role in ground distribution. A smaller diameter TDV is not desirable for use as a signal TDV, since smaller diameter TDVs are more difficult to fill. Notably, there are often voids in high aspect-ratio TDVs. However, such constraints do not apply if the TDVs are to be used as "dummy" TDVs for sinking noise currents. That is, the TDVs 604 will sink noise currents even if they include voids as a result of the fabrication process. For example, dummy TDVs may have a diameter between 5 and 7 μm, whereas signal TDVs may have diameters between 7 and 15 μm.

Returning to FIG. 4, the ground TDVs 404 are used to distribute ground to the die 104-2. In another embodiment, the ground TDVs 404 may be configured similarly to the ground TDVs 604 of FIG. 6 in that they can be dummy TDVs that do not distribute ground to the die 104-2, but still have diameters equal to the diameters of the signal TDVs 402. In yet another embodiment, some of the ground TDVs 404 may distribute ground to the die 104-2, while others of the TDVs 404 may be dummy TDVs.

Figure 8:
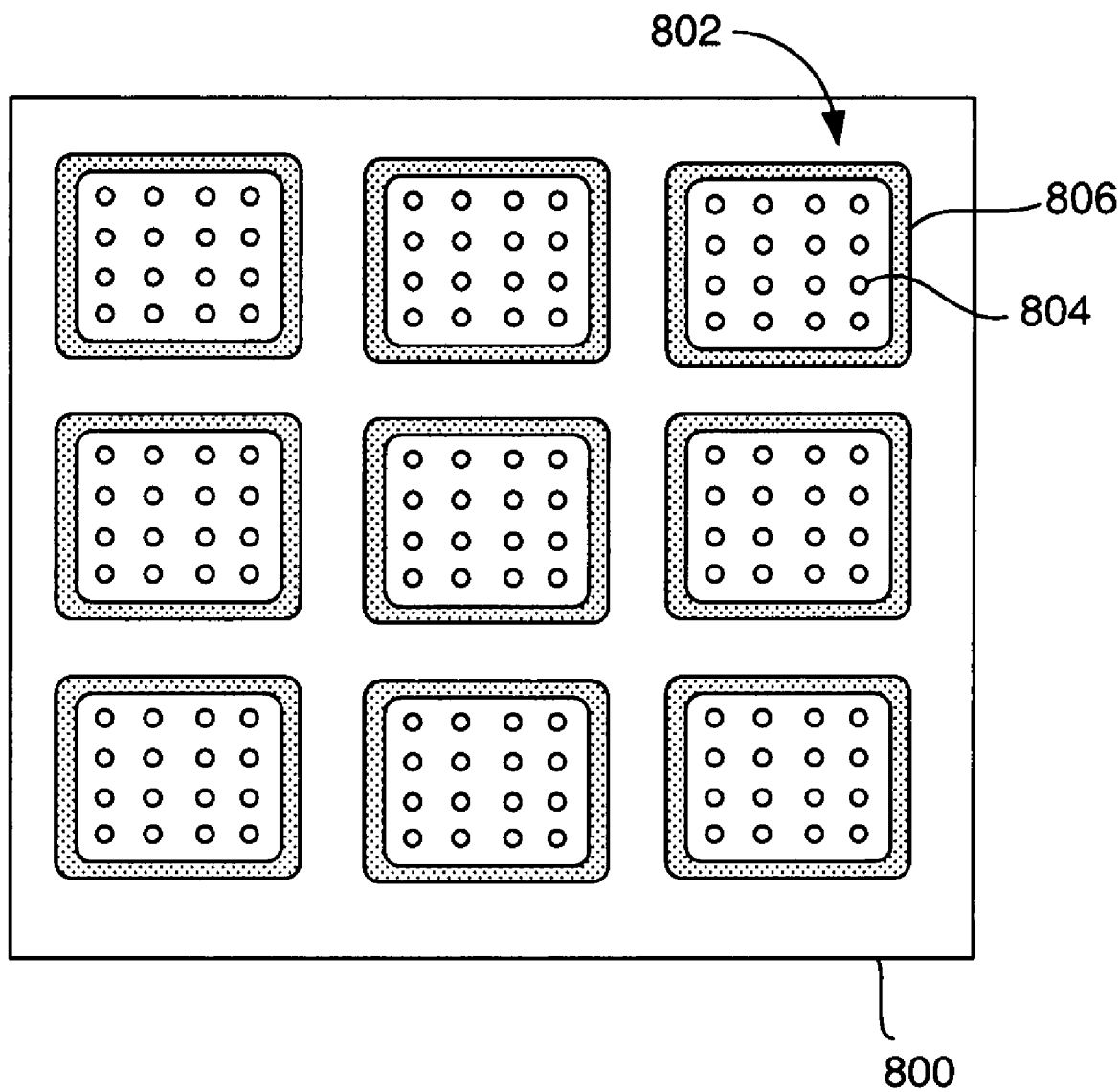
FIG. 8 is a plan view depicting another embodiment of a portion of an integrated circuit die in accordance with one or more aspects of the invention.

FIG. 8 is a plan view depicting another embodiment of a portion 800 of the die 104-1 in accordance with one or more aspects of the invention. The portion 800 includes groups 802 of signal TDVs 804. Each of the groups is surrounded by a ring structure 806. In one embodiment, the ring structure 806 is a diffusion ring, such as that described in the embodiment of FIGS. 2 and 3. In another embodiment, the ring structure 806 comprises a ring of ground TDVs, such as that described in the embodiments of FIGS. 4-7. In either embodiment, the ring structure 806 provides a sink for noise currents injected into the substrate by the signal TDVs. By grouping the signal TDVs 804 together in larger groups, the area overhead of the ring structure 806 is minimized. That is, each ring structure 806 is amortized over many signal TDVs. For example, each block of signal TDVs and surrounding ring structure may occupy an area having a length and width between 300-400 µm and may include hundreds of signal TDVs (e.g., signal TDVs having a 15 µm diameter). Such dimensions are merely exemplary.

Figure 9:
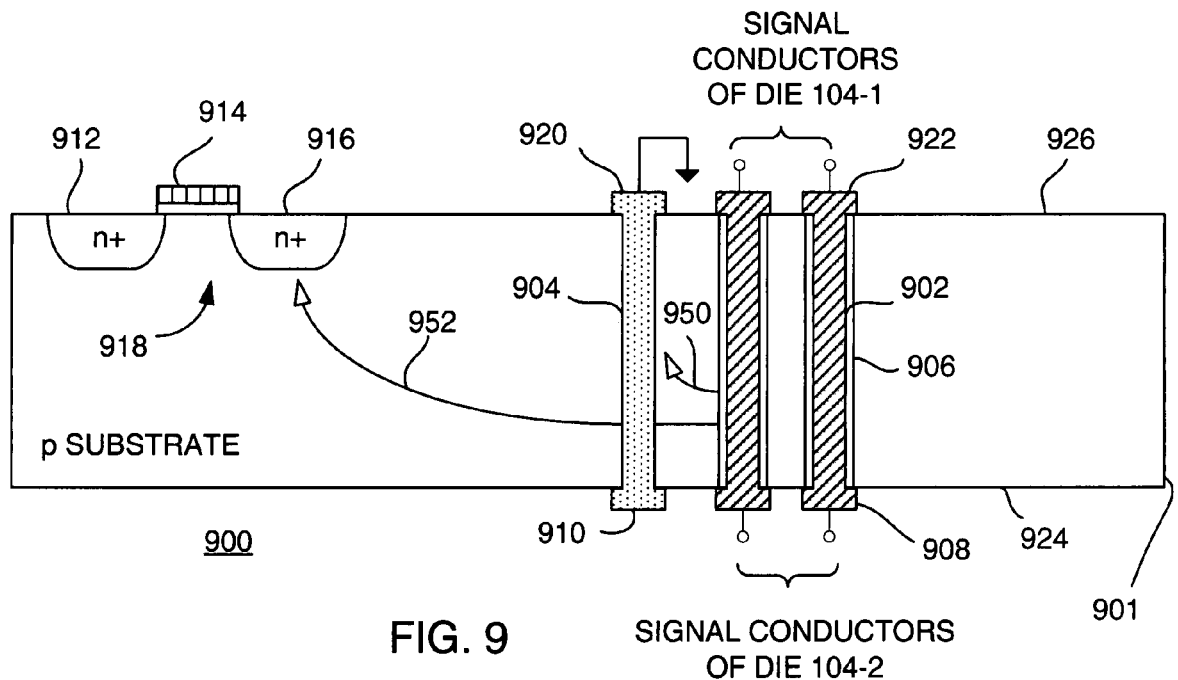
FIG. 9 is a cross sectional view depicting another embodiment of a portion of an integrated circuit die in accordance with one or more aspects of the invention.
Figure 10:
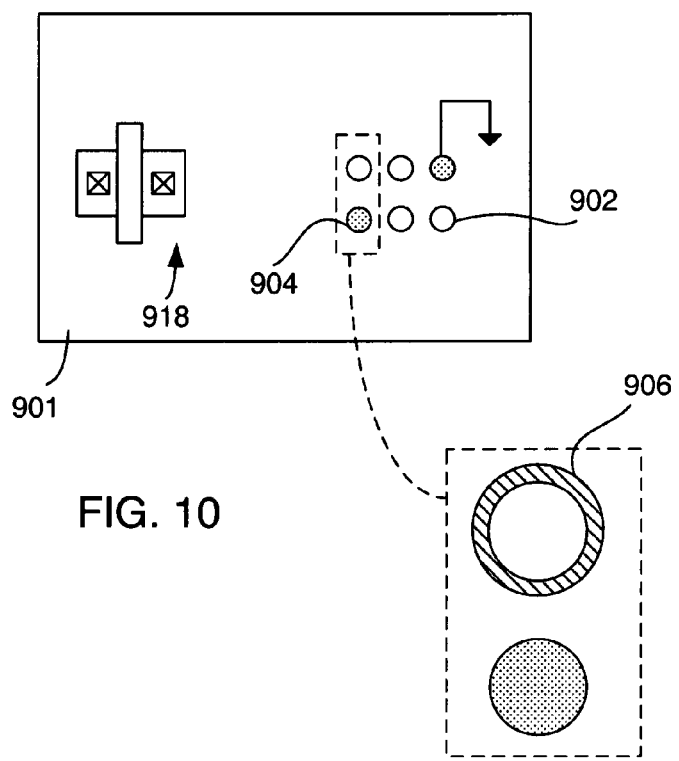
FIG. 10 is a plan view of the integrated circuit die portion of FIG. 9.

FIG. 9 is a cross sectional view depicting another embodiment of a portion 900 of the integrated circuit die 104-1 in accordance with one or more aspects of the invention. FIG. 10 is a plan view of the portion 900. The portion 900 includes a substrate 901. For purposes of clarity, the details of the conductive interconnect are omitted. In the present example, the substrate 901 is formed of p-type doped silicon. The substrate 901 includes an active side 926 and a back side 924. The substrate 901 includes a plurality of TDVs 902 (e.g., four are shown in FIG. 10) and a plurality of TDVs 904 (e.g., two are shown in FIG. 10) formed in the substrate 901. The TDVs 902 and 904 extend from the back side 924 to the active side 926. The TDVs 902 each include a contact 908 on the back side 924 and a contact 922 on the active side 926. The TDVs 904 each include a contact 910 on the back side 924 and a contact 920 on the active side 926. Insulation 906 is provided between the TDVs 902 and the substrate 901. In one embodiment, the TDVs 904 are not insulated from the substrate 901 and thus make direct contact with the substrate 901. An n+ diffusion 912, a gate region 914, and an n+ diffusion 916 form source, gate, and drain of a transistor 918. The transistor 918 is part of a noise-sensitive circuit.

The TDVs 902 are coupled to one or more signal conductors of the die 104-2 and are configured to propagate digital signals ("signal TDVs 902"). The TDVs 904 are coupled to one or more ground conductors of the die 104-1 and are configured to provide ground distribution to the die 104-2 ("ground TDVs 904"). As shown in FIG. 10, the ground TDVs 904 are interspersed among the signal TDVs 902. The ground TDVs 904 provide a sink for noise currents injected into the substrate 901 from the signal TDVs 902.

Notably, the signal TDVs 902 are capacitively coupled to the substrate 901. The ground TDVs 904 are also capacitively coupled to the substrate 901. Since the ground TDVs 904 are in direct contact with the substrate 901, the impedance between the ground TDVs 904 and the substrate 901 is less than it would be if the ground TDVs 904 were insulated from the substrate 901. Moreover, the ground TDVs 904 provide a direct ground contact deep into the substrate 901. The ground TDVs 904 minimize area overhead as compared to the ring structures described above, as they are interspersed throughout the signal TDVs 902.

Impedance paths are formed between the signal TDVs 902 and the ground TDVs 904 through the resistive substrate 901 (collectively represented by an impedance path 950). Impedance paths are also formed between the signal TDVs 902 and the transistor 918 (collectively represented by an impedance path 952). Since the ground TDVs 904 are more proximate the signal TDVs 902 than the transistor 918 and are in direct contact with the substrate 901, the path 950 exhibits less impedance than the path 952. Thus, a larger portion of the noise currents will flow through the impedance path 950 than the impedance path 952. In this manner, the ground TDVs 904 reduce noise currents coupled to the transistor 918.

In the embodiment described above, the ground TDVs 904 are not insulated from the substrate 901 and thus make direct contact with the substrate 901. In another embodiment, a thin layer of insulation may be used to insulate the ground TDVs 904 from the substrate 901. The insulation for the ground TDVs 901 may be thinner than the insulation 906 used for the signal TDVs 902. While not providing a direct ground contact to the substrate 901, the thinly-insulated ground TDVs exhibit reduced impedance with respect to the substrate 901.

The ground TDVs 904 may have the same diameter as the signal TDVs 902. Alternatively, the ground TDVs 904 may have smaller diameters than the signal TDVs. The ground TDVs 904 may be used to distribute ground to the die 104-2. Alternatively, the ground TDVs 904 may comprise dummy TDVs that do not go all the way through the substrate 901. In yet another alternatively, some of the ground TDVs 904 may be used to distribute ground to the die 104-2, while others may be dummy TDVs.

Returning to the embodiments of FIGS. 4-8, the ground TDVs of the ring structures may also make direct contact with their respective substrates or be thinly-insulated from their respective substrates.

Figure 11:
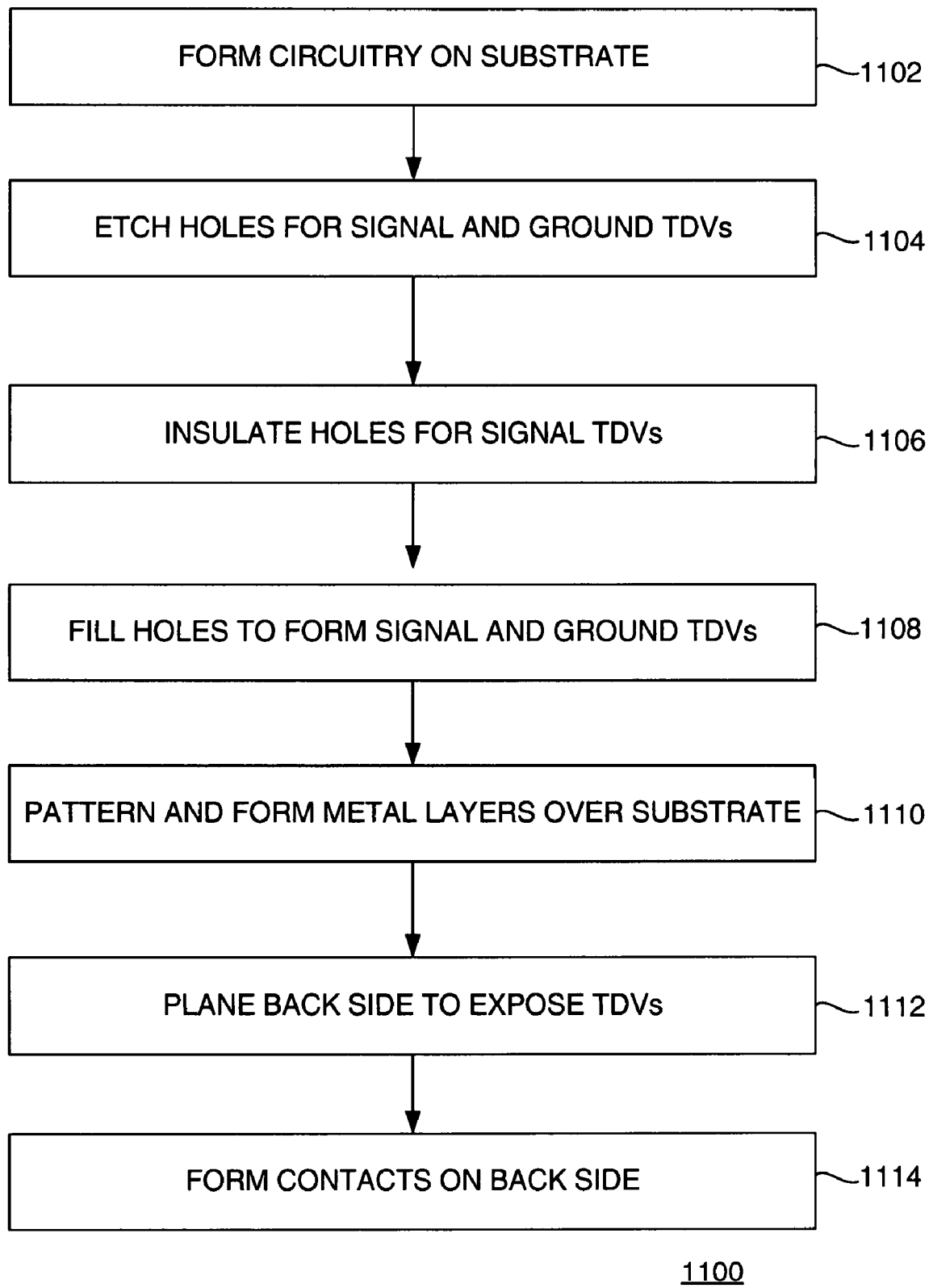
FIG. 11 is a flow diagram depicting an exemplary embodiment of a method of fabricating a semiconductor device in accordance with one or more aspects of the invention.

FIG. 11 is a flow diagram depicting an exemplary embodiment of a method 1100 of fabricating a semiconductor device in accordance with one or more aspects of the invention. In the method 1100, ground TDVs are formed in the semiconductor device interspersed among signal TDVs. In an embodiment, the ground TDVs are formed to make direct contact with the substrate. Alternatively, the ground TDVs may be thinly insulated from the substrate as compared to the signal TDVs. The term "substrate" is meant to encompass a single die or a wafer having multiple dice. A face side of each die of the second substrate is configured to be mounted to the backside of a die of the first substrate thereby forming one or more stacked IC devices. An example of such a device is shown in FIG. 1. The signal TDVs are configured to propagate signals between the dice of each stacked IC device. FIGS. 12 through 16 are cross-sectional views of a die portion related to the fabrication steps described below.

Figure 12:
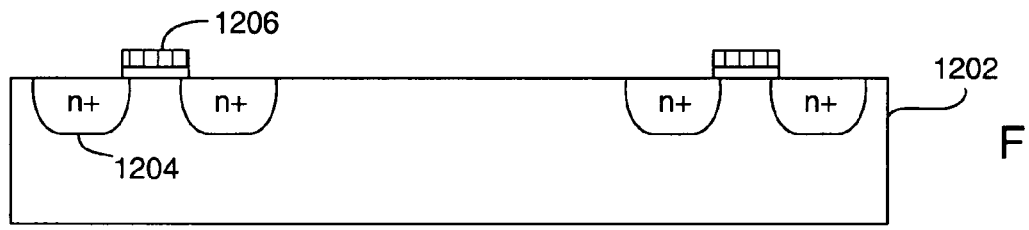
FIGS. 12 through 16 are cross-sectional views of a die portion related to the fabrication steps of the method of FIG. 11.
Figure 13:
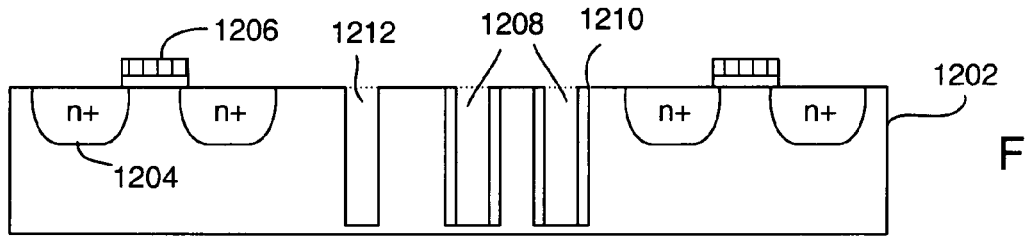

At step 1102, circuitry is formed on a substrate. As shown in FIG. 12, a portion of the circuitry may include n+ diffusions 1204 and polysilicon regions 1206 formed on a substrate 1202. The circuitry may be formed using conventional processing steps. At step 1104, holes are etched for signal TDVs and ground TDVs. As shown in FIG. 13, holes 1208 are etched in the substrate 1202 for the signal TDVs. A hole 1212 is etched in the substrate 1202 for a ground TDV. For example, the holes 1208 and 1212 may be formed using reactive ion etching (e.g., a dry etch process), as is known in the art. At step 1106, an insulating layer is deposited in the holes for the signal vias. As shown in FIG. 13, an insulating layer 1210 is deposited in the holes 1208. Notably, an insulating layer is not deposited in the hole 1212.

Figure 14:
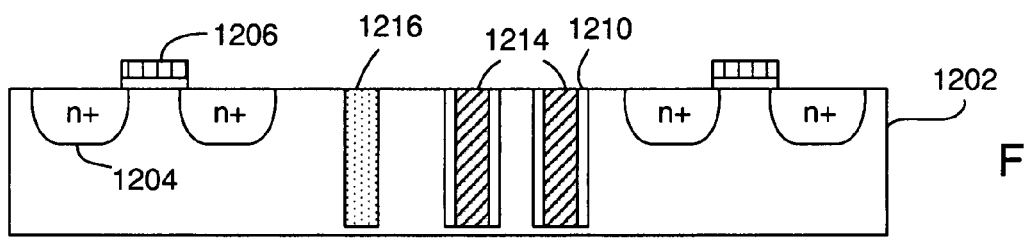

At step 1108, the signal TDVs and ground TDVs are formed. As shown in FIG. 14, signal TDVs 1214 are formed in the holes 1208. A ground TDV 1216 is formed in the hole 1212. The TDVs 1214 and 1216 may be formed by an electroplating technique. Notably, the ground TDV 1216 makes direct contact with the substrate 1202.

Figure 15:
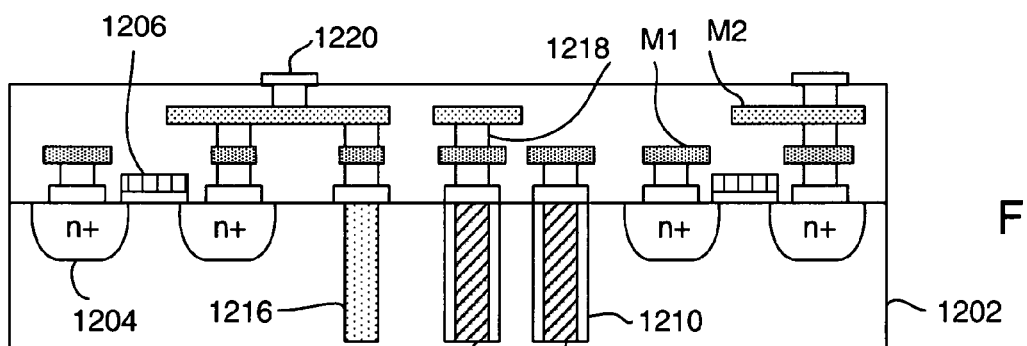

At step 1110, conductive interconnect is formed on the substrate. The conductive interconnect may include a plurality of metal layers and insulating layers with vias interconnecting the metal layers. The conductive interconnect also includes contacts formed on the face side of the die. As shown in FIG. 15, the conductive interconnect illustratively includes metal layers M1 and M2, vias 1218, and contacts 1220.

Figure 16:
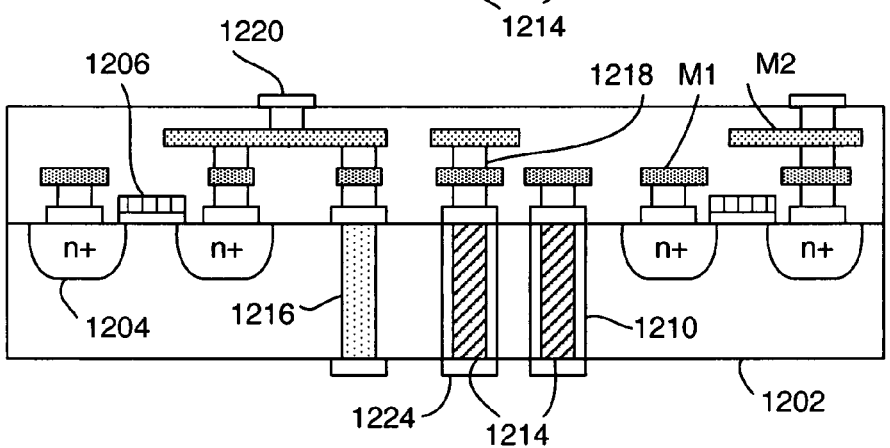

At step 1112, the back side of the substrate is planed to expose the TDVs 1214 and 1216. The back side may be thinned or planned using a conventional etching process. At step 1114, contacts are formed on the back side in electrical communication with the TDVs 1214 and 1216. As shown in FIG. 16, contacts 1224 are formed over the TDVs 1214 and 1216. For clarity, various well known steps have been omitted from the method 1100, such as the formation of mask layers, seed layers, barrier layers, and the like, as well as photolithography steps. Such steps are well understood by those skilled in the art.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A semiconductor device, comprising:
    a semiconductor substrate having conductive interconnect formed on an active side thereof, the conductive interconnect including ground conductors and digital signal conductors;
    at least one signal through die via (TDV) formed in the semiconductor substrate electrically coupled to at least one of the digital signal conductors and being capacitively-coupled to the semiconductor substrate; and
    ground TDVs formed in the semiconductor substrate in a ring around the at least one signal TDV, the ground TDVs being electrically coupled to the ground conductors and configured to reduce noise current injected into the semiconductor substrate from the at least one signal TDV.

2. The semiconductor device of claim 1, wherein diameters of the at least one signal TDV and the ground TDVs are equal.

3. The semiconductor device of claim 1, wherein diameters of each of the ground TDVs are less than a diameter of each of the at least one signal TDV.

4. The semiconductor device of claim 1, wherein each of the ground TDVs and each of the at least one signal TDV includes a contact on a back side of the semiconductor substrate.

5. The semiconductor device of claim 4, further comprising:
    an additional semiconductor substrate electrically and mechanically coupled to each of the ground TDVs and the at least one signal TDV at the contact thereof.

6. The semiconductor device of claim 1, wherein each of the ground TDVs extends from the active side of the semiconductor substrate to a point proximate a back side of the semiconductor substrate.

7. The semiconductor device of claim 1, further comprising:
    at least one noise-sensitive circuit formed on the active side of the semiconductor substrate;
    wherein the ground TDVs are disposed between the at least one signal TDV and the at least one noise-sensitive circuit.

8. A semiconductor device, comprising:
    a semiconductor substrate having conductive interconnect formed on an active side thereof, the conductive interconnect including ground conductors and digital signal conductors;
    a group of signal through die vias (TDVs) formed in the semiconductor substrate, each of the signal TDVs in the group being electrically coupled to at least one of the digital signal conductors and being capacitively-coupled to the semiconductor substrate;
    a ring structure formed in the semiconductor substrate around the group of signal TDVs, the ring structure being electrically coupled to at least one of the ground conductors and configured to reduce noise current injected into the semiconductor substrate from the group of signal TDVs.

9. The semiconductor device of claim 8, wherein the ring structure comprises ground TDVs formed in a ring around the group of signal TDVs, the ground TDVs being electrically coupled to the at least one of the ground conductors.

10. The semiconductor device of claim 9, wherein diameters of the ground TDVs are equal to or less than diameters of the signal TDVs in the group.

11. The semiconductor device of claim 9, wherein each of the ground TDVs and the signal TDVs includes a contact on a back side of the semiconductor substrate, and wherein the semiconductor device further comprises:
    an additional semiconductor substrate electrically and mechanically coupled to each of the ground TDVs in the ring structure and each of the signal TDVs in the group at the contact thereof.

12. The semiconductor device of claim 8, wherein the ring structure includes a diffusion ring formed in the semiconductor substrate.

13. The semiconductor device of claim 12 further comprising a transistor having at least one diffusion region,
    wherein depth of the diffusion ring formed in the semiconductor substrate is greater than depth of the at least one diffusion region.

14. A semiconductor device, comprising:
    a semiconductor substrate having conductive interconnect formed on an active side thereof, the conductive interconnect including ground conductors and digital signal conductors;
    signal through die vias (TDVs) formed in the semiconductor substrate electrically coupled to the digital signal conductors, each of the signal TDVs being insulated from the semiconductor substrate and being capacitively-coupled to the semiconductor substrate; and
    ground TDVs formed in the semiconductor substrate electrically coupled to the ground conductors, each of the ground TDVs being in direct contact with the semiconductor substrate and configured to reduce noise current injected into the semiconductor substrate from the group of signal TDVs.

15. The semiconductor device of claim 14, wherein diameters of the ground TDVs are equal to or less than diameters of the signal TDVs.

16. The semiconductor device of claim 14, wherein each of the signal TDVs and the ground TDVs includes a contact on a back side of the semiconductor substrate.

17. The semiconductor device of claim 16, further comprising:
    an additional semiconductor substrate electrically and mechanically coupled to each of the signal TDVs and the ground TDVs at the contact thereof.

18. The semiconductor device of claim 14, wherein each of the ground TDVs extends from the active side of the semiconductor substrate to a point proximate a back side of the semiconductor substrate.

* * * * *